United States Patent [19]
Hurst

[11] 4,027,175
[45] May 31, 1977

[54] THRESHOLD LOGIC GATES

[75] Inventor: Stanley Leonard Hurst, Bristol, England

[73] Assignee: National Research Development Corporation, London, England

[22] Filed: Feb. 25, 1976

[21] Appl. No.: 661,265

Related U.S. Application Data

[63] Continuation of Ser. No. 505,513, Sept. 12, 1974, abandoned.

[30] Foreign Application Priority Data

Sept. 20, 1973 United Kingdom .............. 44143/73

[52] U.S. Cl. .......................... 307/211; 307/220 R; 307/233 R; 328/48; 328/92; 328/158
[51] Int. Cl.² .................. H03K 19/42; H03K 23/00
[58] Field of Search ........... 307/211, 220 R, 223 R, 307/208; 328/48, 46, 41, 92, 96, 97, 158, 159; 235/153 BK

[56] References Cited

UNITED STATES PATENTS

| | | | |
|---|---|---|---|
| 3,162,774 | 12/1964 | Winder | 307/211 |
| 3,184,663 | 5/1965 | Mergler | 328/61 X |
| 3,229,115 | 1/1966 | Amarel | 328/104 |
| 3,657,658 | 4/1972 | Kubo | 328/48 X |
| 3,780,213 | 12/1973 | Harna | 328/48 X |

Primary Examiner—John Zazworsky
Attorney, Agent, or Firm—Oblon, Fisher, Spivak, McClelland & Maier

[57] ABSTRACT

A threshold logic gate comprises a digital summation unit and means for adding to the count in the summation for each active input of the gate. The summation unit may be either a combinational logic array, operating in parallel or a scanning unit operating sequentially.

4 Claims, 5 Drawing Figures (1)

THRESHOLD LOGIC GATES

This is a continuation of application Ser. No. 505,513, filed Sept. 12, 1974, and now abandoned.

This invention relates to threshold logic gates.

Threshold logic gates are similar to normal Boolean gates in that their inputs and outputs are binary signals. However, in contrast to Boolean gates, their outputs obey a form of arithmetic summation so as to change state when the sum of their weighted inputs exceeds a predetermined threshold. A fuller description of known threshold logic gates is given is S. L. Hurst, "Threshold Logic," Mills & Boon Ltd., London, 1971, pages 55 to 66.

At present, threshold logic gate circuits involve the generation of pre-set units of current or voltage which are then switched into or out of summation circuits by the binary inputs of the gates. The output voltage of the summation circuit is sampled and, when it exceeds a predetermined value, the gate output changes state. In all such circuits, the tolerance on circuit component parameters places a limit on the discrimination of the gate and hence upon the number of inputs and/or their weights which can be successfully incorporated into a single gate. It is an object of the present invention to provide a threshold logic gate which is not subject to limitations of this nature.

According to the invention, a threshold logic gate comprises a digital summation unit, means for adding to the count in said summation unit for each active input of the gate, and means responsive to the summation unit for providing an output signal when the count in the summation unit exceeds a predetermined value.

Preferably the gate includes weighting means to apply predetermined weighting factors to each input so that, if such input is active, the amount by which the count in the summation unit is increased is determined by the weighting factor. However, the invention is also applicable to threshold logic gates which do not have this facility in which case "1" is added to the count stored in the summation unit for each active input.

In one form of the invention, the addition is carried out sequentially. The summation unit takes the form of a counter and the gate includes means for sequentially scanning the inputs, the counter being reset at the beginning of each scan.

In another form of the invention, the data from the various inputs is maintained in a parallel form, and the summation unit takes the form of a network of combinational logic gates, the network being arranged to simultaneously add the first input to the second input, the third input to the resulting total and so on.

Two embodiments of the invention will now be described by way of example with reference to the accompanying drawings, in which:

FIG. 1 shows a threshold logic gate of the type in which the data from the various inputs is maintained in parallel form. The threshold logic gate has a summation unit 10 consisting of a network of identical cells such as the cell 12.

Figure 2:
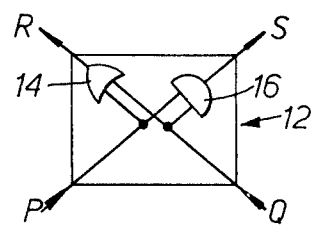
FIG. 2 is a schematic diagram for an element of the threshold logic gate illustrated in FIG. 1.

Referring to FIG. 2, each cell 12 has two inputs P and Q and two outputs R and S. Both inputs are connected to the output R via an OR gate 14 and to the output S via an AND gate 16. Thus, if both inputs P and Q are at logic 1, the output S is at logic 1 and otherwise it is at logic 0. If either of the inputs P and Q is at logic 1, the output R is at logic 1 and if both inputs are at logic 0, the output R is at logic 0.

Referring again to FIG. 1, the cells of the network are connected together diagonally with the S outputs of the various cells connected to the P input of the next diagonal cell and the R outputs connected to the Q input. The S outputs of the cells in the right-hand and of each row are connected to the Q inputs of cells in the next row while, at the left-hand side of the array, the P inputs form the inputs of the summation unit 10 and the R outputs form the outputs thereof. The Q input of the bottom cell 12 forms an additional input for the summation unit and similarly the S output for the to cell 18 forms an additional output.

The threshold logic gate has seven input terminals 20 to 26. It will be observed that the input terminal 20 is connected to the P input of two of the cells of the summation unit 10 while the inputs 20 to 25 are each connected to a single P input and the terminal 26 is connected to a single Q input. The effect of this is that the input 20 has weighting factor 2 while the remaining inputs 21 to 26 each have weighting factor 1.

Consider, by way of example, the situation when logic level 1 is applied to terminals 20, 25 and 26 while logic level 0 is applied to the remaining inputs. Since both terminals 25 and 26 are at logic 1, 1's are applied to both the P and the Q inputs of cell 12 and consequently logic 1's appear both at its R output, which is connected to cell 28 and at its S output which is connected to cell 29. The cell 28 thus has logic 1 applied to its Q input but logic 0 applied to its P input (from terminal 24). Consequently, it produces logic 1 at its R output but logic 0 at its S output which forms the P input to the cell 29. Thus the cell 29 has logic 0 applied to its P input, by cell 28, and logic 1 applied to its Q input by cell 12. Therefore the R output of cell 29 is at logic 1 and the S output at logic 0. Continuing through the array, the cells 30 to 35 each have logic 1 applied to their Q inputs and logic 0 applied to their P inputs because terminals 21 to 24 are at logic 0. However, cell 36 which is connected to terminal 20 has logic 1 applied to its Q input from cell 34. Consequently, both its output R and its output S are at logic 1. Thus cell 37 has logic 1 applied both to its P input from cell 36 and to its Q input from cell 35 and consequently it produces logic 1's at both its R output and its S output.

Cell 37 has its S output logic 1 which is therefore applied to the P input of cell 38. The Q input of cell 38 is a logic 0 (because the S outputs of all the cells, 29, 31, 33 and 35 are at logic 0) and consequently the R output of cell 38 is at logic 1 and the S output at logic 0. By a similar process, it can be shown that the R outputs of cells 39 to 42 are at logic 1 while the R outputs of cells 43, 44 and 18 and the S output of cell 18 are at logic 0. These outputs are connected to terminals 45 to 52 respectively and consequently four of the terminals, namely terminals 45 to 48, are at logic 1.

Thus, with one input having weight 2 and two inputs having weight 1 at logic 1, and the remaining inputs at logic 0, the four of the output terminals 45 to 52 nearest the left-hand end of the array are at logic 1. In fact, the number of outputs at logic 1 is always equal to the weighted sum of the number of inputs at logic 1.

In the simplest form of this embodiment of the invention, the output terminal corresponding to the required threshold is used to provide a direct indication of whether or not the weighted sum of the inputs reaches the required threshold value. No matter where a logic 1 input is applied to the gate, the count output will always build up from left to right and there will never be a transitory logic 1 on a high value output terminal. Similarly, when any input reverts from logic 1 to logic 0, the highest value output line will directly cancel to logic 0, a transitory logic 0 never appearing towards the left of the cell outputs and then cascading up to its final steady-state position.

Figure 1:
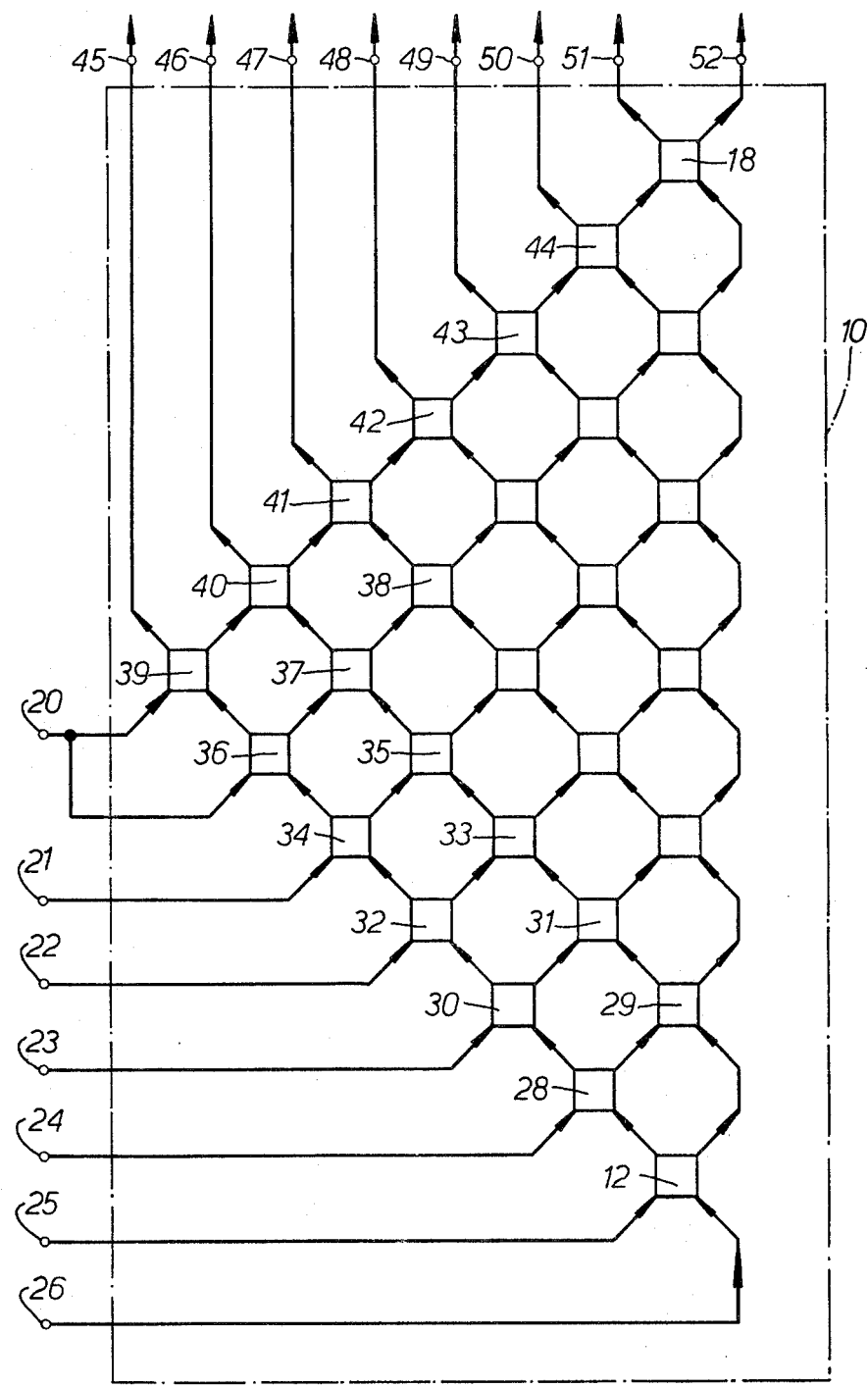
FIG. 1 is a schematic diagram of a threshold logic gate in accordance with an embodiment of the invention.
Figure 3:
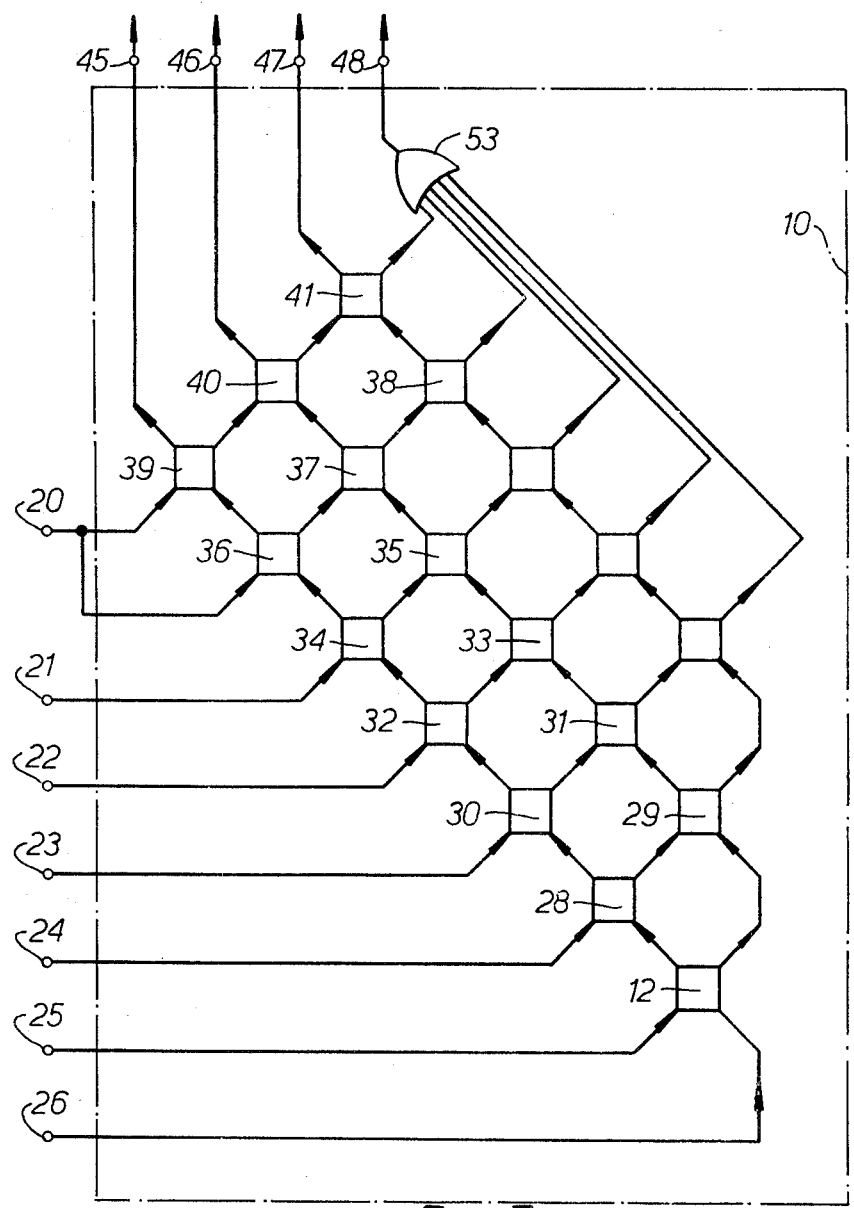
FIGS. 3 and 4 are schematic diagrams of respective modified versions of the threshold logic gate shown in FIG. 1.

The gates shown in FIGS. 1 and 2 may be used to provide a fixed threshold by making a permanent connection to one of the output terminals 45 to 52, or a variable threshold by providing means for selectively establishing a connection to any of the output terminals 45 to 52.

Where the required threshold has a fixed value or a maximum value less than the weighted sum of all the inputs, any of the output terminals to the right of the terminal indicating such fixed or maximum value and a corresponding part of the array of cells are not required and may be omitted if desired. Further, since the S outputs of the cells in the top right hand diagonal row would then be left unconnected, the entire row of cells may be replaced by a single multi-input OR gate. For example, FIG. 3 shows a threshold logic gate having a maximum threshold value of four. In comparison with FIG. 1, the cell 18 and the rows containing cells 43 and 44 respectively have been omitted. The row containing the cell 42 has been replaced by an OR gate 53, the output of which is connected to the terminal 48.

Figure 4:
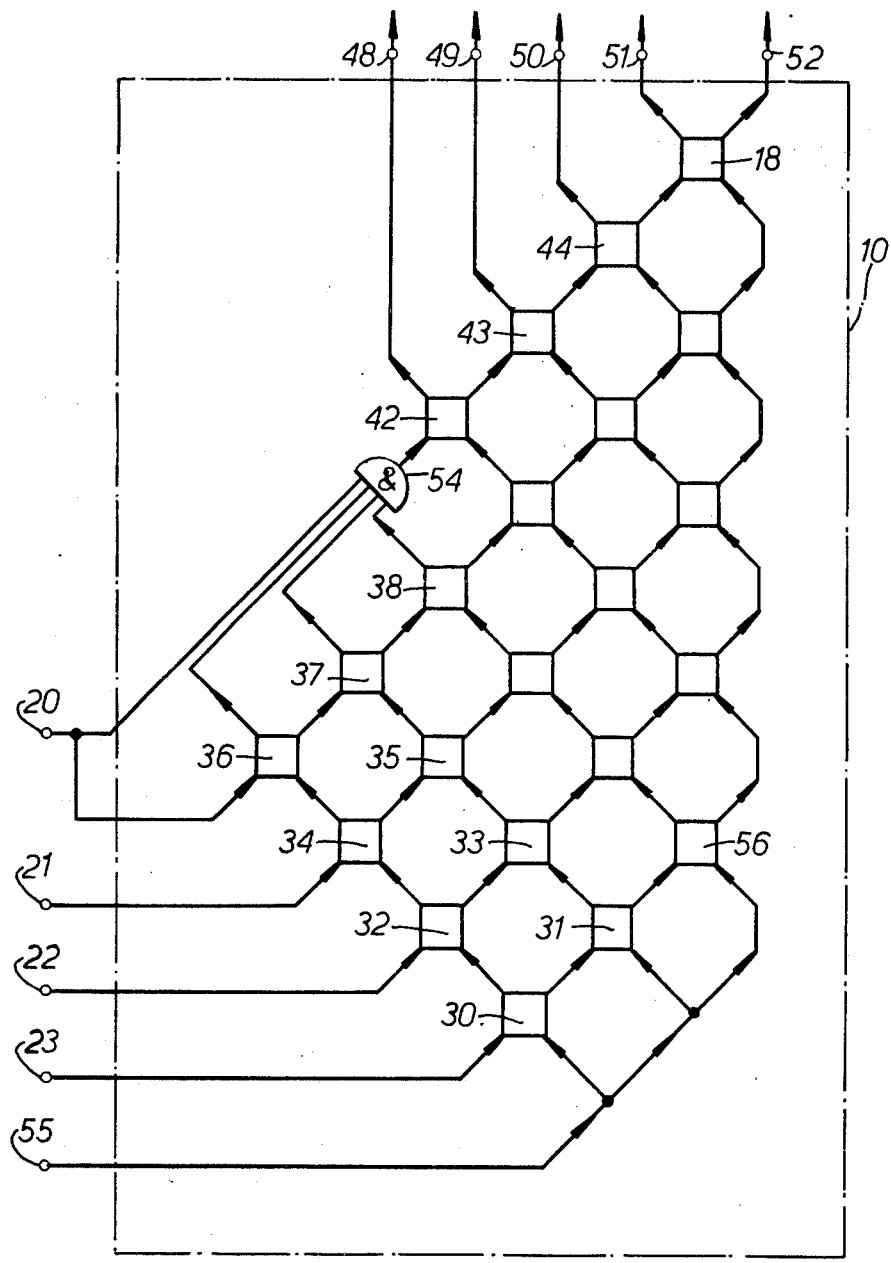

An analogous economy of cells can be made where the required threshold has a minimum value greater than one. For example, FIG. 4 shows a threshold logic gate having a minimum threshold value of four. In comparison with FIG. 1, the cells 39, 40 and 41 have been replaced by an AND gate 54. Where the required threshold has a fixed value, both the expedient illustrated in FIG. 3 and that illustrated in FIG. 4 may be adopted.

FIG. 4 also illustrates a way of economizing in the number of cells required by feeding an input having a weighting greater than one, preferably the highest weighted input, into the bottom corner of the array. In FIG. 4, the input terminals 20, 21, 22 and 23 are connected as before but the input terminals 24, 25 and 26 are replaced by a single input terminal 55 which is directly connected to the cells 30, 31 and 56, thus providing an input having a weighting factor of three.

It is of course possible to provide for multi-threshold operation by establishing connections to more than one of the output terminals 45 to 52.

It is also possible to provide a threshold logic gate with functionally similar combinational logic summation action, in which "0" logic levels rather than "1" logic levels are cascaded through part or all of the summation unit 10.

Figure 5:
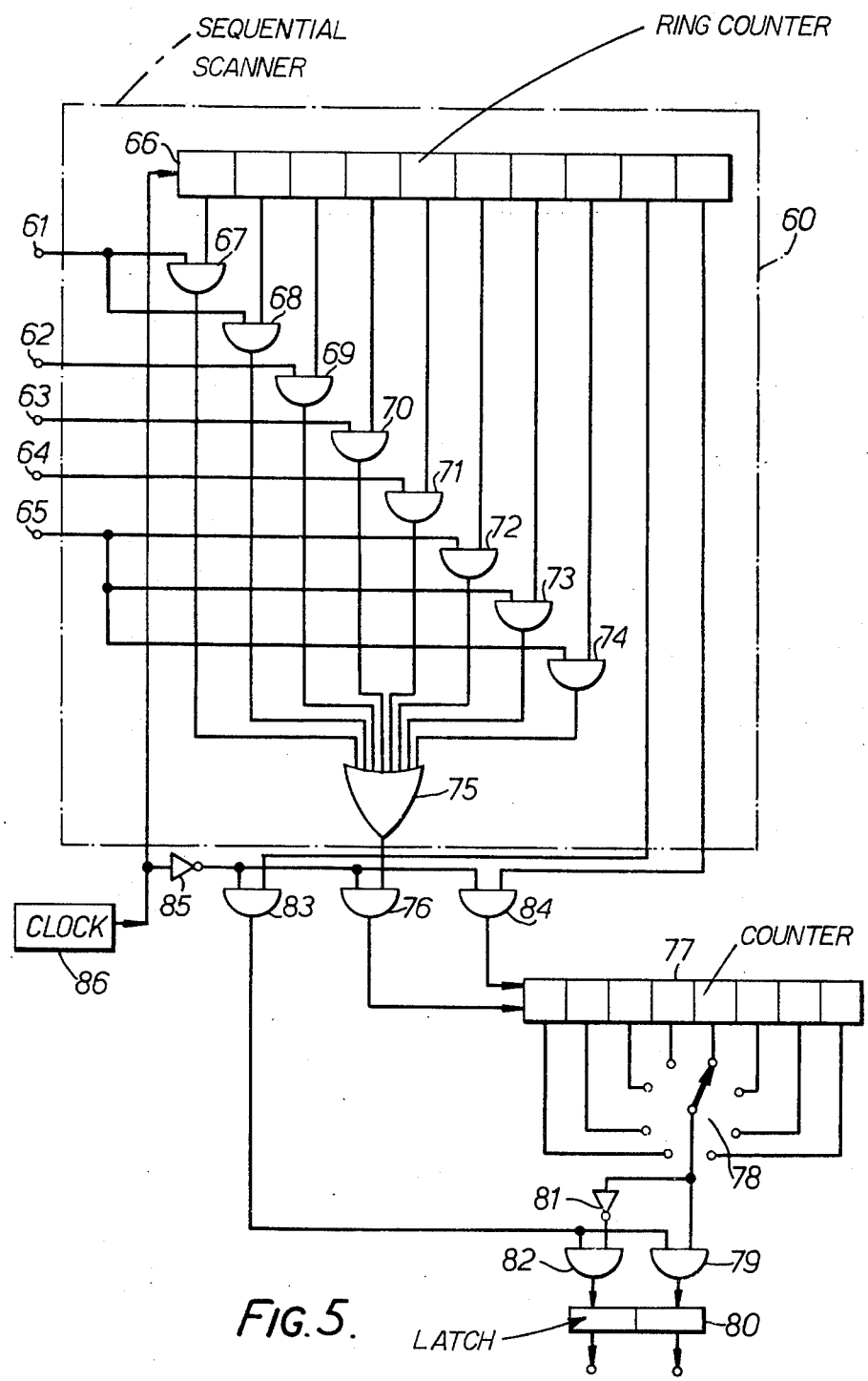
FIG. 5 is a schematic diagram of a threshold logic gate in accordance with another embodiment of the invention.

FIG. 5 illustrates a threshold logic gate in accordance with the invention in which addition is carried out sequentially. A sequential scanner 60 has five input terminals 61 to 65. The input 61 has weighting factor 2 and the input terminal 65 has weighting factor 3. The remaining input terminals 62, 63 and 64 have weighting factor 1.

The sequential scanner 60 consists of a ten-stage ring counter 66 in which a single digit 1 is permanently circulated to that at any one instant, one and only one output of the counter 66 is at logic 1. The first eight stages of the counter 66 perform the muliplexing operation and are connected to respective AND gate 67 to 74. The remaining two stages are used for control purposes at the end of each scan as will be explained hereinafter. The input terminal 61, which has weight 2 is connected to two AND gates 67 and 68 and the input terminal 65 which has weight 3 is connected to three AND gates 72, 73 and 74. The remaining input terminals 62, 63 and 64 are each connected to a respective AND gate 69, 70, and 71. The outputs of all the AND gates 67 to 74 are combined by an OR gate 75 the output of which forms the output of the multiplexer 60. It will thus be apparent that the multiplexer 60 is required to have a number of channels equal to the weighted sum of all the inputs.

The output of the multiplexer 60 is connected via an AND gate 76 to a counter 77 which takes the form of a shift register. The various stages of the shift registers are connected to respective contacts of a multiposition switch 78, the moving contact of which is connected via an AND gate 79 to the set input of a latch 80. The moving contact of the switch 78 is also connected via an inverter 81 and an AND gate 82 to the reset input of the latch 80. The output of the ninth stage of the counter 66 is connected via an AND gate 83 to the second input of the AND gates 79 and 82. The output of the tenth stage of the counter 66 is connected via an AND gate 84 to a "clear all stages" input of the shift register 77. The second inputs of the AND gates 76, 83 and 84 are connected via an inverter 85 to the output of a clock 86. The output of the clock 86 is also directly connected to step the counter 66. Thus, when the counter 66 is being stepped, the AND gates 76, 83 and 84 are all closed.

In operation, with input signals applied to the various input terminals 61 to 65, the clock 86 supplies pulses to successively step the counter 66. The counter 66 opens each of the AND gates 67 to 74 in turn so that, if the corresponding input signal is at logic 1, logic 1 is applied via the OR gate 75 to the AND gate 76 which opens during the period between successive clock pulses to allow the shift register 77 to be stepped. The effect of this is that, as the scan proceeds, the shift register 77 fills with 1's from the left-hand end, the total number of 1's after gate 74 has opened being equal to the weighted sum of the input signals at terminals 61 to 65.

When the ninth stage of the counter 66 becomes active, the gate 83 is opened so that, during the next succeeding interval between clock pulses, AND gates 79 and 82 open and the latch 80 is set or reset in dependence on whether the stage of the shift register to which the moving contact of the multiposition switch 78 is connected contains a 1 or a 0. In other words, the latch 80 is set if the threshold has been reached and reset if it has not been reached.

The next clock pulse activates the tenth stage of the counter 66 so that, during the next interval between the clock pulses, the AND gate 84 opens resetting all stages of the shift register 77 to zero. The gate is then ready to begin the next scan.

If the threshold logic gate illustrated in FIG. 5 is required for fixed threshold operation, the multiposition switch 78 can be replaced by direct connection to the appropriate stage of the shift register 77. Subsquent stages of the shift register 77 can be omitted but no other economy of apparatus is possible. If multithreshold operation is required, a separate latch 80 and associated gates are required for each threshold.

The choice between the type of gate illustrated in FIG. 1 and that illustrated in FIG. 5 will depend on the conditions of use. As the number of gate input increases, the number of components required increased more slowly for the version shown in FIG. 5 than for the version shown in FIG. 1. Assuming that no economy is made by restricting the maximum and/or minimum threshold level as illustrated in FIGS. 3 and 4, the break-even point comes at about twelve inputs. On the other hand, the response time of the gate illustrated in FIG. 1 is always less than that of the gate illustrated in FIG. 5 and the difference of response time increases with the number of inputs.

I claim:

1. A threshold logic gate comprising:
  a plurality of activable input terminals;
  a counter;
  scanning means for performing a scanning operation to sequentially scan said input terminals and connected to said counter to add to the count in said counter as each active input terminal is scanned, the scanning operation having a beginning and a conclusion;
  means responsive to the count in said counter for providing an output signal at the conclusion of the scanning operation indicating whether the count in the counter exceeds a predetermined value; and
  means for resetting the counter at the beginning of the scanning operation.

2. A threshold logic gate as claimed in claim 1, wherein said scanning means has a plurality of inputs and including weighting means for applying an integral weighting factor to one of said plurality of input terminals comprising means for connecting said one of said plurality of input terminals to a number of the inputs to said scanning means, said number being equal to the required weighting factor.

3. A threshold logic gate comprising:
  a network comprising combinational logic cells arranged in rows and columns and having a plurality of network inputs and a plurality of network outputs;
  each combinational logic cell having first and second cell inputs, first and second cell outputs, an AND gate and an OR gate, the first and second cell inputs being connected both to respective inputs and the AND gate and to respective inputs of the OR gate, the output of the AND gate forming the first cell output and the output of the OR gate forming the second cell output;
  the cell at the beginning of each row having its first input connected to a network input and each of the remaining cells of each row having its first input connected to the first output of the next adjacent cell in the row;
  the cell at the end of each column having its second output connected to a network output and each of the remaining cells in each column having its second output connected to the second input of the next adjacent cell in the column.
  whereby the signal at each end of the network outputs indicates whether the sum of the signals of the network inputs exceeds a respective predetermined threshold value.

4. A threshold logic gate as claimed in claim 3, including a plurality of input terminals; and weighting means for applying an integral weighting factor to one of said plurality of input terminals comprising means for connecting said one of said plurality of input terminals to a number of inputs to said network, said number being equal to the required weighting factor.

* * * * *